United States Patent
Hara et al.

(10) Patent No.: US 6,828,657 B2
(45) Date of Patent: Dec. 7, 2004

(54) ACTIVE MATRIX SUBSTRATE AND METHOD OF MANUFACTURING THE SAME

(75) Inventors: Yujiro Hara, Yokohama (JP); Masahiko Akiyama, Tokyo (JP); Yutaka Onozuka, Yokohama (JP); Tsuyoshi Hioki, Yokohama (JP); Mitsuo Nakajima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/190,663

(22) Filed: Jul. 9, 2002

(65) Prior Publication Data

US 2003/0010970 A1 Jan. 16, 2003

(30) Foreign Application Priority Data

Jul. 10, 2001 (JP) .......................... 2001-208724

(51) Int. Cl.[7] ...................... H01L 29/06; G02F 1/1362
(52) U.S. Cl. ...................... 257/623; 257/619; 349/42; 349/45; 349/58
(58) Field of Search ............................ 257/9, 59, 72, 257/618, 619, 623; 349/42, 45, 56, 58

(56) References Cited

U.S. PATENT DOCUMENTS

| 4,772,099 A | * | 9/1988 | Kato et al. .................. 350/334 |
| 5,299,041 A | * | 3/1994 | Morin et al. .................. 359/59 |
| 5,783,856 A | | 7/1998 | Smith et al. |
| 5,904,545 A | | 5/1999 | Smith et al. |
| 6,380,687 B1 | * | 4/2002 | Yamazaki .................. 315/169.3 |

FOREIGN PATENT DOCUMENTS

| JP | 406230426 A | * | 8/1994 | .......... G02F/1/136 |
| JP | 2001-7340 | | 1/2001 | |

* cited by examiner

Primary Examiner—Nathan J. Flynn
Assistant Examiner—Johannes Mondt
(74) Attorney, Agent, or Firm—Oblon, Spivak, McClelland, Maier & Neustadt, P.C.

(57) ABSTRACT

An active matrix substrate comprises a substrate, a position control member provided on the substrate and surrounding a specific space by a sidewall thereof to expose a surface of the substrate and whose inner side face inclines at a specific angle with respect to the substrate, an active element provided so as to engage with the inner side face of the position control member and whose outer side face has at least a part that inclines at substantially the same angle as the specific angle of the inner side face of the position control member with respect to the substrate, and an adhesion section which bonds the active element to the substrate or the position control member and whose wettability with the position control member is lower than that of the adhesive with the substrate.

13 Claims, 10 Drawing Sheets

ACTIVE MATRIX SUBSTRATE AND METHOD OF MANUFACTURING THE SAME

CROSS-REFERENCE TO RELATED APPLICATIONS

This application is based upon and claims the benefit of priority from the prior Japanese Patent Application No. 2001-208724, filed Jul. 10, 2001, the entire contents of which are incorporated herein by reference.

BACKGROUND OF THE INVENTION

1. Field of the Invention

This invention relates to an active matrix substrate and a method of manufacturing active matrix substrates 2. Description of the Related Art Liquid-crystal displays (LCDs) have been widely used as display terminals for mobile information units, such as notebook personal computers, televisions, mobile phones, or mobile information terminals (or PDAs). For example, an active matrix LCD is formed as follows: thin film transistors (TFTs), which use amorphous silicon or polycrystalline silicon as an active layer, are formed in a matrix on a glass substrate and secured with an approximately 5-$\mu$m gap between the TFTs and an opposite glass substrate, the gap being filled with liquid crystal, thereby completing an active matrix LCD. This type of active matrix LCD is used as a thin display unit that provides high-quality, full-color display.

On the other hand, there have been demands that LCDs should consume less electric power, have a larger number of pixels, be larger in size, weigh less, help decrease manufacturing costs, assure high-quality display, etc.

Active elements, such as TFTs, are formed by repeating the following processes: electrodes, an insulating layer, etc. are formed on a glass substrate by vacuum processes, including CVD and sputtering techniques, and then are subjected to photolithography and dry etching or wet etching, thereby forming a pattern. Therefore, to obtain a large display unit, it is necessary to make the apparatus for vacuum processes larger, resulting in higher manufacturing costs. Since the percentage of the area of the display unit taken up by the active elements is small, it is wasteful to use a large apparatus for vacuum processes.

To make a display unit lighter, the formation of TFTs on a plastic substrate or a film substrate has been studied. Forming TFTs on those substrates requires the process temperature to be lowered. However, it is conceivable that a drop in the process temperature will degrade the TFT performance and therefore impose a limitation on the picture quality, the number of pixels, etc. Moreover, since those substrates have high thermal expansion coefficients and are deformed plastically at low temperature, a higher definition design is expected to be impossible, which leads to a decline in the quality of display.

A method of solving those problems has been disclosed in Jpn. Pat. Appln. KOKAI Publication No. 2001-7340. In the method, active elements, such as TFTs, are formed on an element formation substrate made of glass, silicon, or the like and then selectively transferred to another display substrate (or a final substrate) made of plastic, film, or the like. Thereafter, the active elements are interconnected.

FIG. 1 shows one step in the method of transferring and forming active elements disclosed in Jpn. Pat. Appln. KOKAI Publication No. 2001-7340. In this method, active elements 2701, such as TFTs, are formed on an element formation substrate (not shown) and then transferred to an intermediate substrate 2702. The active elements 2701 on the intermediate substrate 2702 are further transferred to a final substrate 2703.

In this method, the active elements 2701 and the intermediate substrate 2702 are bonded together via a temporary adhesion layer 2704. The temporary adhesion layer 2704 is made of a material that has adhesion and lowers in adhesion when being illuminated by light or heated. As shown in FIG. 1, adhesion layers 2705 are formed beforehand in regions on the final substrate 2703 where the active elements 2701 are to be transferred. The active elements 2701 are transferred in such a manner that light or heat is projected via a mask 276 onto only the active elements to be transferred, while the active elements 2071 are being pressed against the adhesion layers 2705.

In the method disclosed Jpn. Pat. Appln. KOKAI Publication No. 2001-7340, active elements have been formed on an element formation substrate with a high density and then selectively transferred to a final substrate, thereby improving the production efficiency. In this method, however, since the positions of the active elements are not determined on the surface of the final substrate, the accuracy of the alignment of the intermediate substrate with the final substrate determines the accuracy of the positions of the active elements. Therefore, when the final substrate is produced by a plurality of transfers, the positions of the active elements shift, resulting in variations in the shift. When interconnections are made after the process of transferring the active elements, a shift in the position causes variations in the parasitic capacitance between the active elements, interconnections, and electrodes, resulting in a decline in the quality of display.

Furthermore, to increase the position accuracy in transferring the active elements, there is a method of making tapered hollows in a final substrate and transferring tapered active elements to the final substrate.

In this method, since both of the active elements and the final substrate have been tapered, the active elements fit into the tapered hollows in the final substrate, achieving the transfer with high position accuracy. In this transfer, however, since the active elements are pushed into the hollows in the final substrate, thereby carrying out transfer, this makes it difficult to selectively transfer densely formed active elements to the final substrate.

As described above, in forming an active matrix substrate, it was impossible to selectively transfer active elements with high position accuracy by a conventional method of transferring active elements. Therefore, there has been a need to realize an active matrix substrate which enables active elements to be selectively transferred with high position accuracy and a method of manufacturing such active matrix substrates.

BRIEF SUMMARY OF THE INVENTION

According to a first aspect of the present invention, there is provided an active matrix substrate comprising: a substrate; a position control member provided on the substrate and having an opening at a central position thereof to expose a top surface of the substrate the opening being surrounded by a sidewall of the position control member, the position control member having an inner side face which inclines at a specific angle with respect to the substrate; an active element having a fitting member abutting the bottom of said active element, said active element being positioned on the position control member and configured to engage with the inner side face of the position control member and an outer side face of the fitting member has at least a part that inclines at substantially the same angle as the specific angle of the inner side face of the position control member with respect to the substrate; and an adhesion section which includes an adhesive that bonds the active element to the position control member and whose wettability with the position control member is lower than that of the adhesive with the substrate.

According to a second aspect of the present invention, there is provided an active matrix substrate comprising: a substrate; a position control member provided on a top surface of the substrate and has a concave part that is made up of an inner side face inclining at a specific angle with respect to the substrate and a bottom part connecting to the inner side face; an active element provided on the position control member, a fitting member abutting a bottom surface of the active element so as to engage with the concave part of the position control member and an outer side face of the fitting member has at least a part that inclines at substantially the same angle as the specific angle of the inner side face of the position control member; and an adhesion section which includes an adhesive that bonds the active element to the substrate or the position control member, with a contact angle of the adhesive to the position control member being 70° or more.

DETAILED DESCRIPTION OF THE INVENTION

Figure 1:
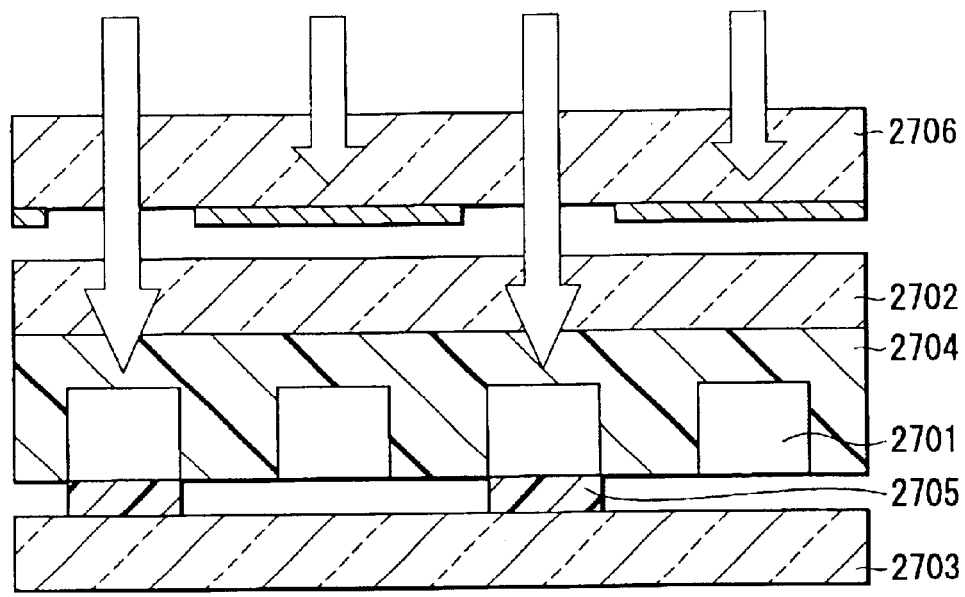
FIG. 1 is a sectional view to help explain one process of a conventional method of manufacturing active matrix substrates.

Hereinafter, referring to the accompanying drawings, embodiments of the present invention will be explained in detail.

(First Embodiment)

In a first embodiment, active elements are formed on an element formation substrate (or a first substrate). After the active elements on the element formation substrate are then transferred to an intermediate substrate (or a second substrate), they are processed so as to have a tapered portion provided on the bottom surface. Then, tapered position control members are also formed on a final substrate (or a third substrate). The active elements are aligned with the tapered position control members and transferred to the final substrate, which completes an active matrix substrate. The position control members enable the active elements to be transferred at the proper positions.

The configuration of an active matrix substrate will be explained by reference to FIG. 16. The active matrix substrate of the first embodiments includes active elements 103 each having, on its bottom surface, an etching stopper layer 102 whose cross section inclines perpendicularly to the surface of the substrate, and position control members 108 whose inner side face is tapered so as to engage with the corresponding etching stopper layer 102 on a final substrate 107. Each of active element 103 has the etching stopper layer 102 on its bottom surface as a fitting member to the corresponding position control member 108. The etching stopper layer is bonded to the final substrate 107 via an adhesion section 109.

On the entire surfaces of these component parts, a post-transfer interlayer insulating layer (or post-transfer insulators) 111 is provided. Contact sections are provided in the regions of the post-transfer interlayer insulating layer corresponding to the electrodes of the active elements 103. On each contact section, an interconnection 112 and a pixel electrode 113 are formed.

A method of manufacturing active matrix substrates according to the first embodiment will be explained by reference to FIGS. 2 to 16.

Figure 2:
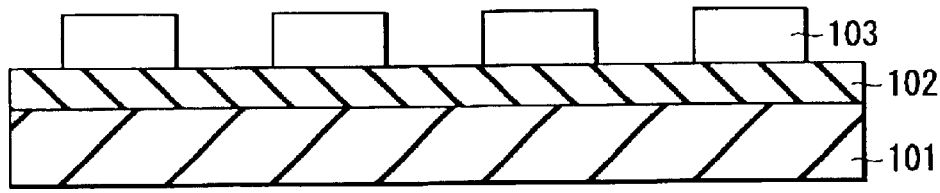
FIGS. 2 to 8 are sectional views to help explain stepwise a method of manufacturing active matrix substrates according to a first embodiment.

As shown in FIG. 2, on the element formation substrate 101 made of silicon, alkali-free glass, quartz, or the like, an etching stopper layer 102 is formed to a thickness of about 0.1 to 10 µm using an insulating material, such as tantalum oxide (TaOx), alumina (AlOx), silicon oxide (SiOx), or silicon nitride (SiNx). In the first embodiment, the element formation substrate 102 is removed by grinding and etching as described later. Therefore, it is desirable that a material whose etching selection ratio to the element formation substrate 101 is high should be used as a material for the etching stopper layer 102.

On the etching stopper layer 102, a plurality of active elements 103 are formed. Each active element 103 includes a polycrystalline silicon TFT or a circuit including a polycrystalline silicon TFT, an amorphous silicon TFT or a circuit including an amorphous silicon TFT, or a crystalline silicon TFT or a circuit including a crystalline silicon TFT. The number of elements constituting each active element is not limited to one. It is desirable that an active element should have one side of about 20 to 100 µm in length and a thickness of about 1 to 5 µm, and an inter-element distance of 3 to 20 µm. In the first embodiment, the thickness of the etching stopper layer 102 is set to about 1 µm, the size of an active element 103 is set as a square about 36 µm long, the distance between adjacent elements is set to about 6 µm, and the pitch in element arrangement is set to about 42 µm.

Figure 3:
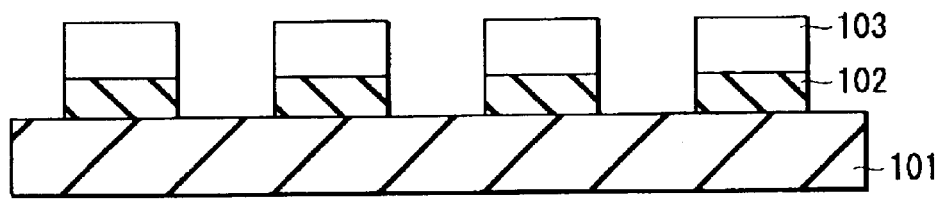
Figure 4:
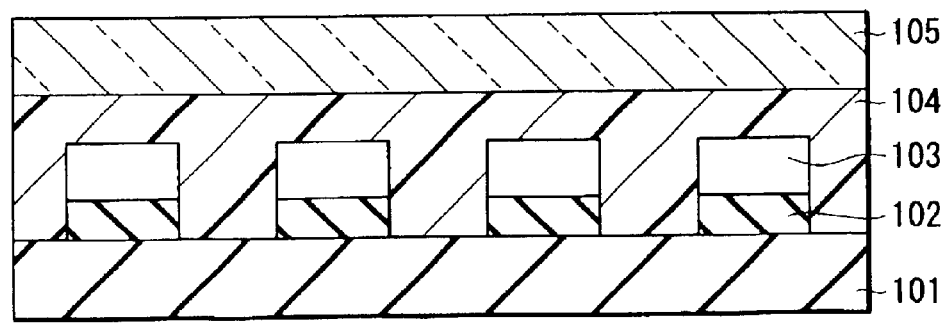

Next, as shown in FIG. 3, the etching stopper layer 102 is separated into pieces in such a manner that the pieces correspond to the active elements 103 in a one-to-one ratio. The etching stopper layer 102 is processed as follows. A resist (not shown) is patterned into the shapes of active elements 103 using photolithographic techniques. With the resulting resist as a mask, the etching stopper layer 102 is etched by reactive ion etching (RIE) techniques or the like. The separation of the etching stopper layer 102 may be performed after the removal of the element formation substrate 101, which will be explained later Next, as shown in FIG. 4, an intermediate substrate 105 made of glass, plastic, or the like is prepared. A temporary adhesion layer 104 is sandwiched between the surface of the element formation substrate 101 at which the active elements 103 have been formed and the intermediate substrate 105 and then laminated together. A material that has adhesion and is stimulated to peel in the presence of ultraviolet rays, such as an acrylic adhesive including benzophenone, may be used as the temporary adhesion layer 104. The temporary adhesion layer 104 is applied to the intermediate substrate 105 and bonded to the element formation substrate 101. In the first embodiment, the film thickness of the temporary adhesion layer 104 is set to about 4 $\mu$m.

Figure 5:
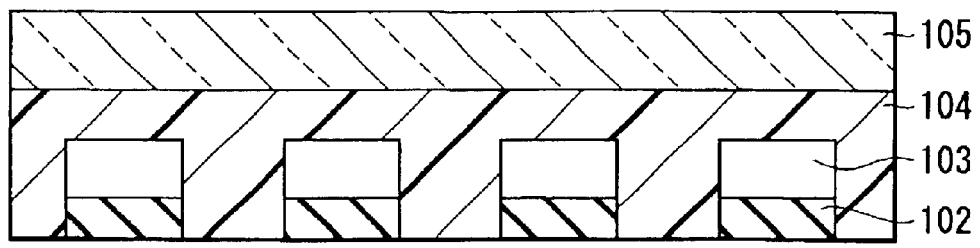

Next, as shown in FIG. 5, the element formation substrate 101 is removed. For example, when a glass substrate is used as the element formation substrate 101, the element formation substrate 101 is made thinner by mechanical grinding. The resulting substrate is then etched with a mixed solution of hydrofluoric acid and surfactant, or the like. The material for and the layer quality of the etching stopper layer 102 and the material for the etchant are selected so that etching may stop at the etching stopper layer 102.

Figure 6:
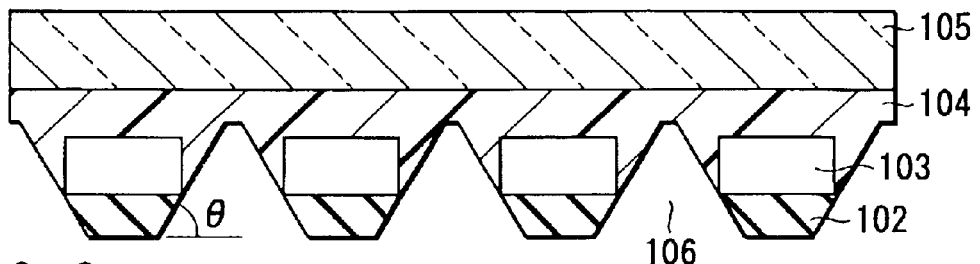

Next, as shown in FIG. 6, the etching stopper layer 102 and then the temporary adhesion layer 104 are etched into tapered shapes for each active element 103, thereby making a cut 106 with a specific angle.

The temporary adhesion layers 104 around the active elements 103 are not necessarily tapered, and all of the temporary adhesion layers around the active elements 103 may be etched away so that the individual active elements 103 are separated completely.

Dry etching, wet etching, or the like may be used. Use of isotropic etching conditions enables tapered shapes to be obtained.

It is desirable that the taper angle (the angle the cut surface makes to the bottom surface of the etching stopper layer) should be about 30 degrees or more and about 85 degrees or less. With the taper angle less than 30 degrees, the active elements are hard to move when they are pressed while deviating from their proper positions in a transfer process explained later, which makes it hard for them to fit into the desired positions. With the taper angle larger than about 85 degrees, the allowance of shifts in the positions of the active elements is too small in a transfer process explained later.

The etching condition for etching the etching stopper layer 102 into a tapered shape may differ from the etching condition for etching the temporary adhesion layer 104 into a tapered shape or a shape other than a tapered shape. Even when the temporary adhesion layer 104 is tapered, the tapered shapes of the etching stopper layers 102 may differ from the tapered shape of the temporary adhesion layer 104.

Figure 7:
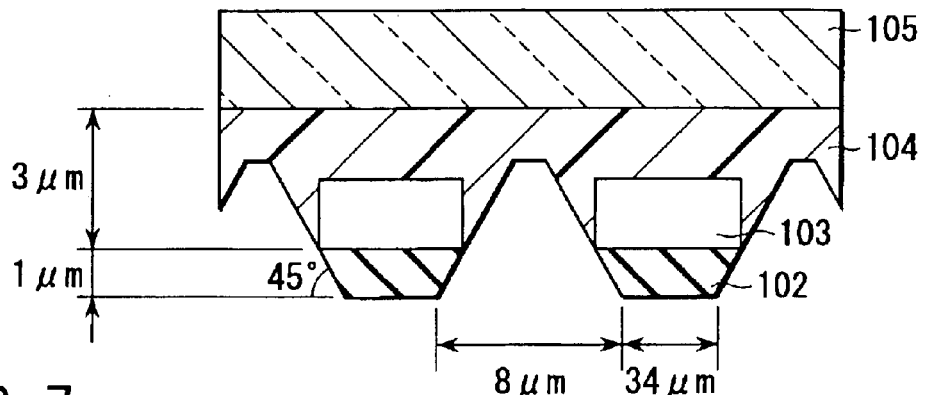

In the first embodiment, as shown in FIG. 7, the taper angle is set to about 45 degrees and the maximum width of the cut 106 in the etching stopper layer 102 is set to about 8 $\mu$m. As a result, the width of the bottom surface of the remaining part of the etched etching stopper layer 102 is about 34 $\mu$m.

Figure 8:
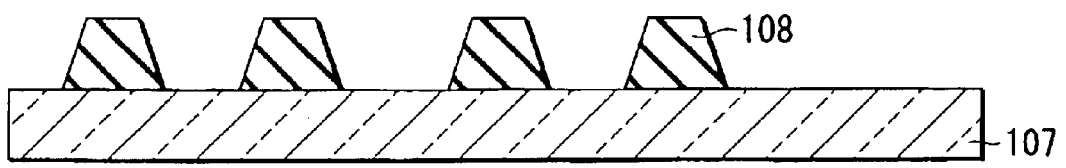
Figure 9:
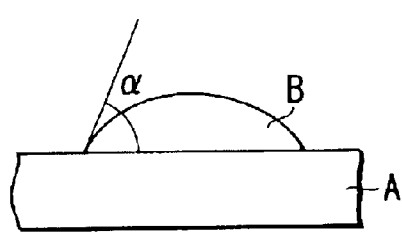
FIG. 9 is a drawing to help explain a contact angle of adhesive.

On the other hand, as shown in FIG. 8, position control members 108 have been formed in parts of the final substrate 107 to which the active elements (including the etching stopper layer) are to be transferred. The final substrate 107 is made of alkali-free glass, soda-lime, plastic, or metal foil. The position control members 108 are formed so as to enclose the corresponding active elements when the active elements are transferred, and to have a tapered shape with an inner side face in contact with the etching stopper layer 102.

In the first embodiment, photosensitive acrylic resin is applied to a thickness of about 2 $\mu$m and the resulting layer is patterned by photolithographic techniques, thereby forming the position control members 108. The material for the position control members 108 is not limited to this. Another material may be used, provided the wettability with the adhesion section using adhesive is low.

For example, an organic material with a low wettability with a normally used adhesive, such as silicon resin, styrene, polypropylene, or fluorine-based polymer, may be formed as the position control member 18 by spin coating techniques or the like. Moreover, an oxide such as $SiO_2$, tantalum oxide, or alumina, or SiNx may be formed by sputtering, evaporation, spin coating techniques or the like and then coated with silicon or fluorine, thereby decreasing the wettability. In regions where adhesion sections are to be formed, the wettability may be increased by carrying out a primer coating process, followed by the selective formation of the adhesion sections.

The wettability of the adhesion section with the position control member 108 indicates the degree of adhesion between them. With the wettability between them being low, when there is a slope, the adhesive tends to flow downward and is unlikely to stay in the same position. In a case where the adhesion section is placed on a certain member, when the contact angle of the surface of the adhesion section is large because of adhesion tension or the like, the wettability between the position control member 18 and the adhesion section is low. Therefore, to measure the degree of adhesion, for example, the contact angle of the adhesion section with the position control member 108 is measured.

In this case, the contact angle is defined as an angle of α that the tangent to the end of liquid material B makes with the surface of plate-like material A when liquid material B is placed on the surface of plate-like material A. When plate-like material A is a glass substrate, the contact angle is measured according to, for example, Japanese Industrial Standard JIS R 3257 (1999).

When the wettability, or the degree of adhesion, is low, the contact angle of the adhesion section with the position control member 108 is large. To lower the wettability of the adhesion section with the position control member 108, the contact angle between them is preferably about 70° or more, and more preferably about 90° or more. As described above, the larger contact angle of the adhesion section with the position control member 108 and the low wettability of the adhesion with the position control member 108 allow the adhesion section to flow to the desired position, even if the adhesion section sticks to the tapered part of the position control member 108. It is desirable that the wettability of the adhesion section with the final substrate 107 should be higher than the wettability of the adhesion section with the position control member 108, because the adhesion section is kept stable. In the first embodiment, the contact angle of the adhesive section to the position control member 108 is about 140°.

Furthermore, it is desirable that the height from the surface of the final substrate 107 to the top surface of the position control member 108 is about 0.3 $\mu$m or more and about 10 μm or less. One reason is that, when the height is less than about 0.3 μm, the active element goes over the position control member, which makes it impossible to control the position of the active element. The other reason is that, when the height is larger than about 10 μm, the position control member becomes too large, which deteriorates the high definition of the display element. Therefore, it is more desirable that the height should be 5 μm or less. In the first embodiment, the height from the surface of the final substrate 107 to the top surface of the position control member 108 is set to about 2 μm. To bond the active element to the adhesion layer well, the height from the surface of the final substrate 107 to the top surface of the active element is preferably equal to or larger than the height from the surface of the final substrate 107 to the top surface of the position control member.

The taper angle of the inner side face where the position control member 108 contacts the etching stopper layer is preferably almost the same taper angle given to the, that is, an angle equal to about 30 degrees or more and about 85 degrees or less. With the taper angel less than 30 degrees, when the active element is pressed, while deviating from its proper position, the element is unlikely to move in a transfer process explained later, which makes it difficult for the active element to fit into the desired position. When the taper angle is larger than about 85 degrees, the allowance of a shift in the position of the active element becomes too small in the transfer process explained later. In the first element, to cause the taper shapes of the etching stopper layer 102 to coincide with the taper shapes of the position control members 108, their taper angles are set to about 45 degrees.

Figure 10B:
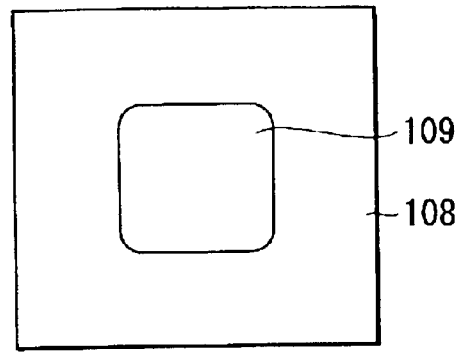
FIGS. 10A and 10B are a sectional view and a plan view, respectively, to help explain a process following the process in FIG. 8.
Figure 10A:
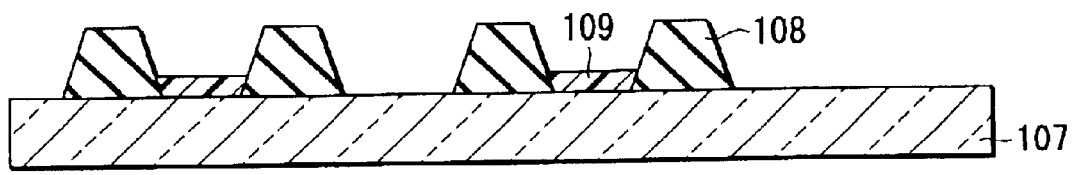

Next, as shown in FIG. 10A, an adhesion section 109 is formed on the inside of the position control member 108 by a screen printing method, a dropping method, or the like. A liquid adhesive, such as an ultraviolet-curing adhesive, epoxy resin, thermosetting adhesive, or acrylic adhesive, is used as the adhesion section 109. At this time, the top surface of the adhesion section 109 is adjusted so as not to be higher than the top surface of the position control member 108. In the embodiment, the height of the adhesion section 109 is set to about 1 μm and the height of the position control member 108 is set to about 2 μm. FIG. 10B is a plan view of the position control member 108 and adhesion section 109 viewed from above.

Figure 11:
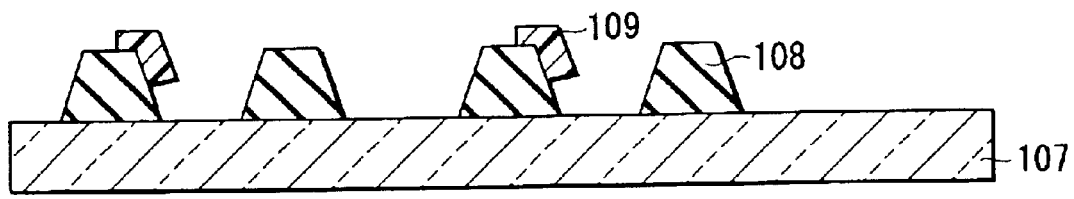
FIG. 11 is a sectional view to help explain a shift in the position of the supply of adhesive in the process of FIG. 10A.

In forming the adhesive section 109, when the element size is small, there is a possibility that the adhesion section 109 will shift a little as shown in FIG. 11 and be formed on the side of the position control member 108. In the first embodiment, however, since the tapered position control member 108 is made of a material whose wettability with the adhesion section 109 is low, the adhesion section 109 falls into the proper position even when being formed in such a position.

Figure 12:
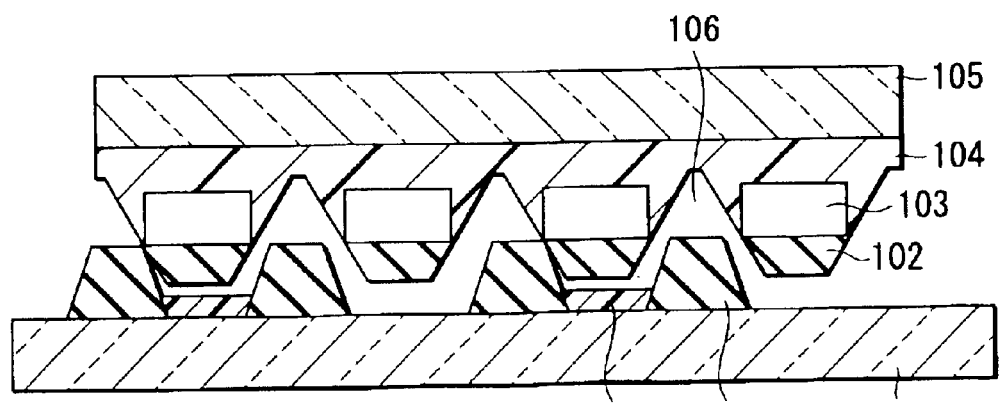
FIGS. 12 to 16 are sectional views to help explain stepwise processes following the process of FIGS. 10A and 10B.

Next, as shown in FIG. 12, the active element 103 on the intermediate substrate 105 is aligned with the position control member 108 on the final substrate 107.

Figure 13:
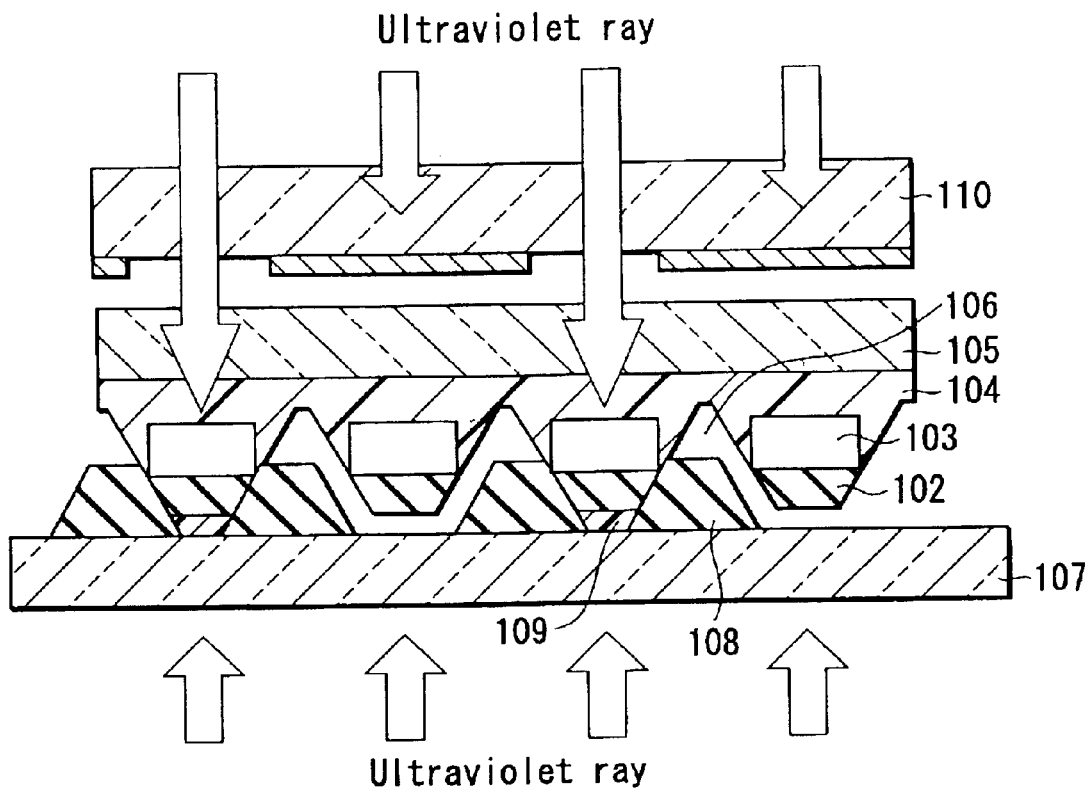

Next, as shown in FIG. 13, ultraviolet rays are projected from the intermediate substrate 105 side via a mask 110 onto the active elements to be transferred, while a suitable pressure is being applied across the intermediate substrate 105 and the final substrate 107. Being illuminated by ultraviolet rays, the temporary adhesion layer 104 corresponding to the chosen active elements 103 decreases in adhesion. At the same time, ultraviolet rays are also projected from the final substrate 107 side, thereby hardening the adhesion layers 109, which bonds the active elements 103 to the final substrate 107.

At this time, since the position control member 108 and etching stopper layer 102 have been tapered, even if the active element 103 deviates from the desired position to which the element 103 is to be transferred, the application of pressure across the intermediate substrate 105 and the final substrate 107 causes the active element 103 to shift to the proper position.

In the first embodiment, the position control member 108 and etching stopper layer 102 have the same tapered shape, the position accuracy of the active element 103 is high. It is preferable to cause both the position control member and the etching stopper layer to have the same tapered shape. Even if they do not have the same tapered shape, it is possible to increase the position accuracy of the active element 103.

Since the position control member 108 are formed into a convex shape on the final substrate 107, only the active elements 103 to be transferred approach the final substrate 107 and the remaining active elements are held stable on the intermediate substrate 5 without being damaged due to contact.

While in the embodiment, ultraviolet rays are selectively projected from the intermediate substrate 105 side onto the active elements 103 via the mask 110, ultraviolet rays may be selectively projected by causing a laser beam in the ultraviolet region to scan.

Figure 14:
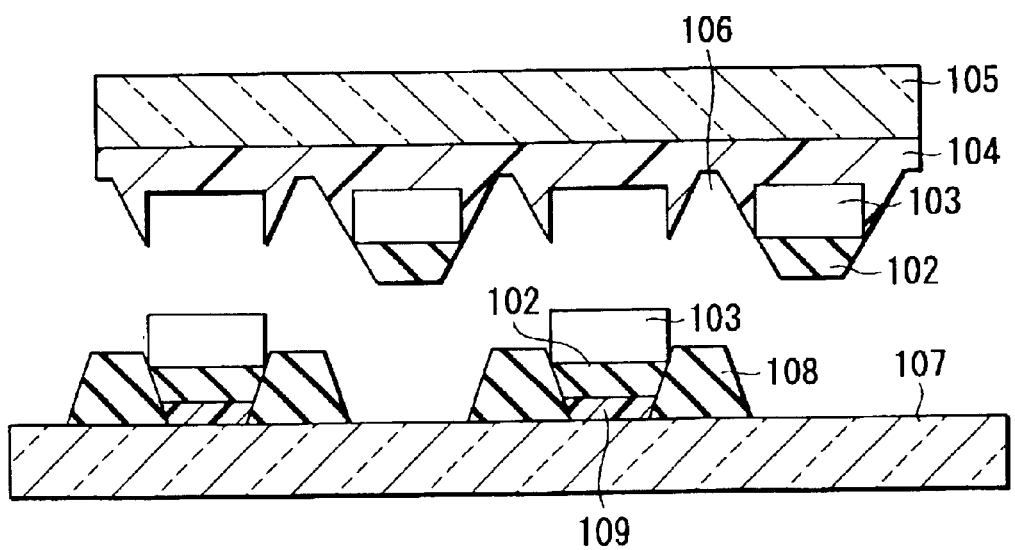

In the state where the adhesion of the temporary adhesion layer 104 is decreased and the adhesion of the adhesion section 109 is generated, the pressure applied across the intermediate substrate 105 and the final substrate 107 is removed, thereby separating the substrates, which causes only the chosen active elements 103 to be transferred to the final substrate 107 as shown in FIG. 14.

Figure 15:
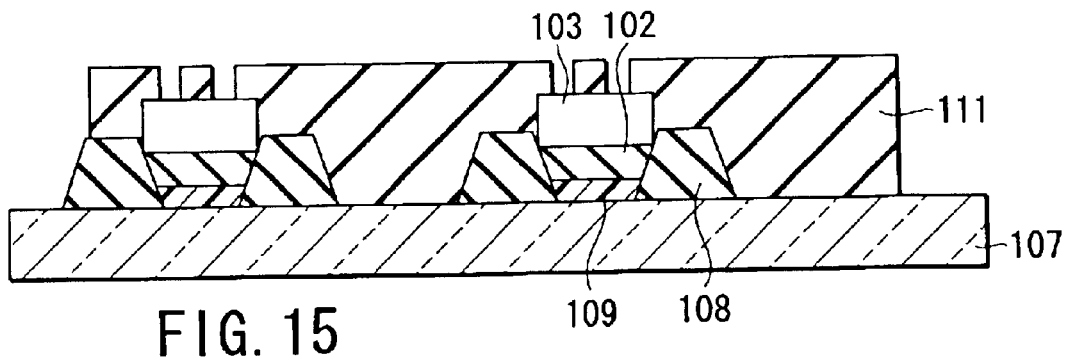

As shown in FIG. 15, on the final substrate 401 to which the active elements 301 have been transferred, a post-transfer interlayer insulating layer (or post-transfer insulator) 111 is formed to a thickness of about 1 to 50 μm. Photosensitive acrylic resin or the like is used as a material for the post-transfer interlayer insulating layer 111. Contact holes are made by photolithographic techniques in the regions of the post-transfer interlayer insulating layer 111 where the active elements 103 have to make contact.

Figure 16:
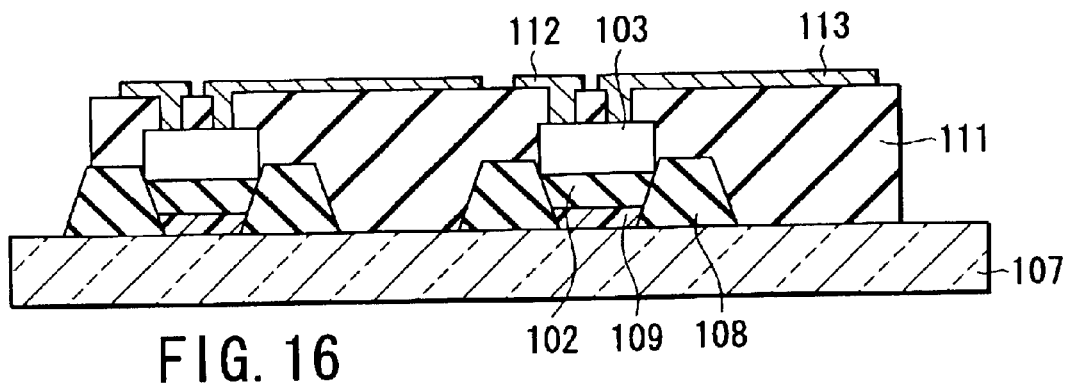

Next, as shown in FIG. 16, a conductive material, such as metal or ITO (Indium Tin Oxide), is sputtered or printed, thereby forming interconnections 112, including signal lines and scanning lines, and pixel electrodes 113. This completes an active matrix substrate of the first embodiment. These inter-connections 112 and pixel electrodes 113 may be made of another material using other processes. Inter-connections may be formed in a plurality of layers.

As described above, in the first embodiment, the position control members 108 and etching stopper layer 102 have been tapered, which enables an active matrix substrate to be formed with high position accuracy. Since the convex position control members 108 are formed on the final substrate 107, the active elements 103 on the intermediate substrate 105 are selectively transferred to the final substrate 107. The remaining active elements 103 are held stable on the intermediate substrate 107 without being damaged. Furthermore, since the position control members 108 are made of a material whose wettability with the adhesion sections 109 is low, this enables the adhesion sections 109 to flow to the proper positions, which causes the active elements 103 to be bonded stably.

(Second Embodiment)

A second embodiment differs from the first embodiment in the shape of the position control member. The second embodiment will be explained, centering on the difference from the first embodiment. Explanation of the same parts as those of the first embodiment will be omitted.

Figure 20:
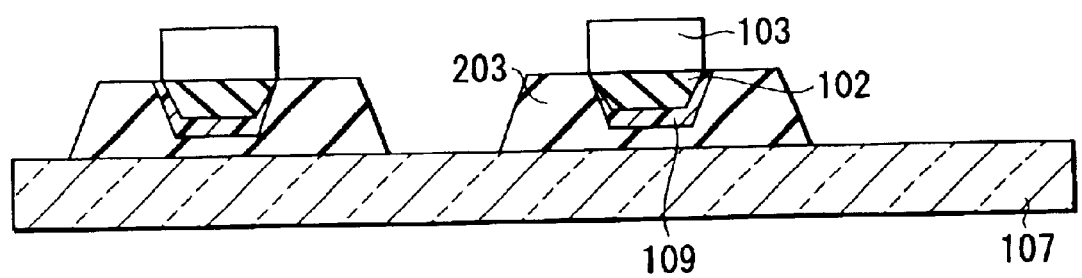

FIG. 20 is a sectional view of active element mounting sections of an active matrix substrate in the second embodiment. In FIG. 20, the configuration of the part above the etching stopper layer 102 is the same as that of the first embodiment and is not shown here. The active matrix substrate of the second embodiment is the same as that of the first embodiment in that tapered position control members 203 whose inner side face is inclined and tapered active elements 103 inclined so as to be enclosed by the position control members are formed on the final substrate 107. However, the position control members 203 differ from those of the first embodiment in that they cover not only the sides of the active elements 103 but also their bottom surfaces so that they are concave. The active elements 103 are bonded to the position control members 203 via the adhesion sections 109.

A method of manufacturing the position control members 203 in the second embodiment will be explained by reference to FIGS. 17 to 29. The remaining part of the manufacturing method is the same as that of the first embodiment.

Figure 17:
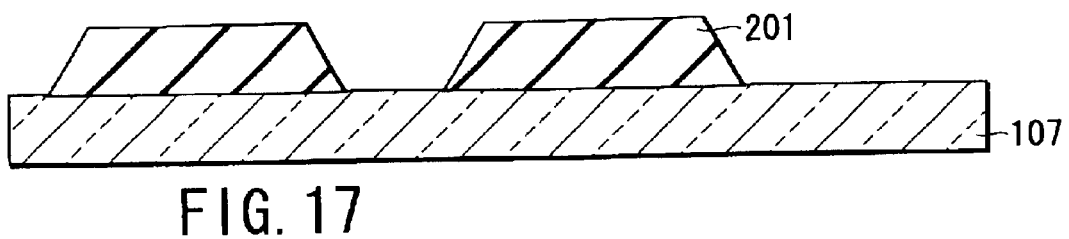
FIGS. 17 to 20 are sectional views to help explain stepwise a method of manufacturing active matrix substrates according to a second embodiment.

As shown in FIG. 17, position control member forming patterns 201 are formed in regions to which active elements are to be transferred and in areas around the regions on a final substrate 107. Photosensitive acrylic resin, which is used as a material for the position control member forming patterns 201, is applied to the entire surface to a thickness of about 5 $\mu$m and then patterned by photolithographic techniques.

Figure 18:
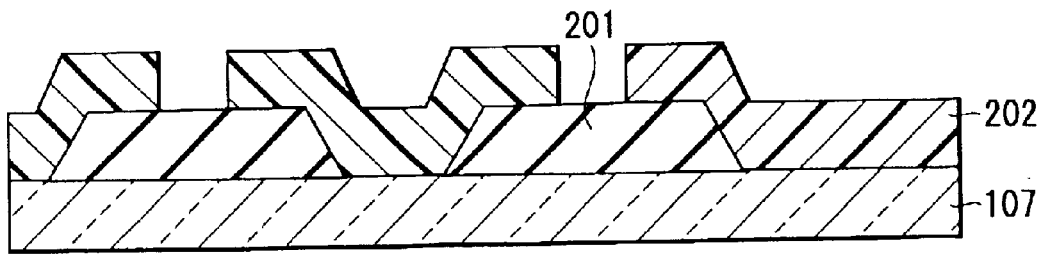

Next, as shown in FIG. 18, a pattern of photoresist 202 is formed which has openings in the regions to which the active elements of the position control member forming patterns 201 are to be transferred.

Figure 19:
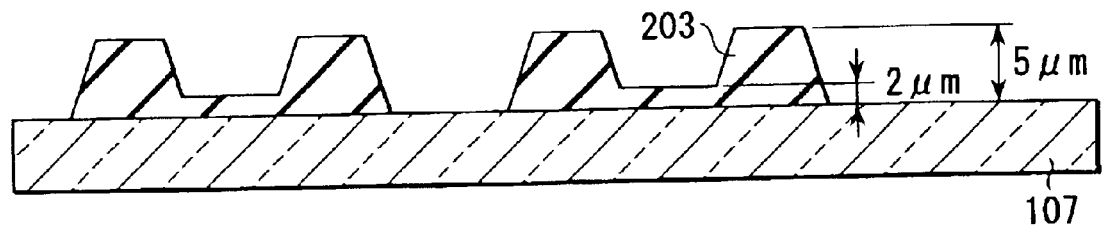

Next, as shown in FIG. 19, after the regions to which the active elements of the position control member forming patterns 201 are to be transferred are made thinner than the areas around the regions, the photoresist 202 is removed, which completes the position control members 203. At this time, the position control member forming patterns 201 are processed by an isotropic dry etching method, a wet etching method, or the like in such a manner that the inner side faces of the position control members 203 in contact with the etching stopper layers are tapered.

In the second embodiment, the thickness of the position control member 203 in the region facing the bottom surface of the active element is set to about 2 $\mu$m and the thickness of the surrounding bank is set to about 5 $\mu$m. The taper angle is set to about 45 degrees (see FIG. 19).

Next, as in the first embodiment, adhesive is supplied to the concave part of the position control member 203 to form adhesive section 109. Choosing a suitable material for the adhesive so that the contact angle of the adhesive to the position control member may be 70° or more enables the adhesive to slide easily onto the bottom of the concave part of the position control member 203 to form adhesive section 109.

Next, as shown in FIG. 20, the active elements 103 are selectively engaged with the position control members 203, thereby performing transfer. Since the position control members 203 whose wettability with the adhesion is low is placed over not only the sides of the active elements 103 but also their bottom surfaces, it is easy for the adhesive to flow and be formed in the proper position. After the adhesive is hardened, the active elements 301 are secured to the position control members 203 by the adhesive section 109 with a suitable strength.

Furthermore, use of the position control members 203 with the bottom makes the adhesion surfaces of the active elements 103 higher. This reduces damage or the like caused by the contact of the untransferred active elements 103 with the final substrate 107 or the like.

In the second embodiment, too, the tapered position control members 103 and etching stopper layers 102 enables the active elements 103 to be selectively transferred, which makes it possible to form an active matrix substrate having high position accuracy with respect to active elements.

Figure 21:
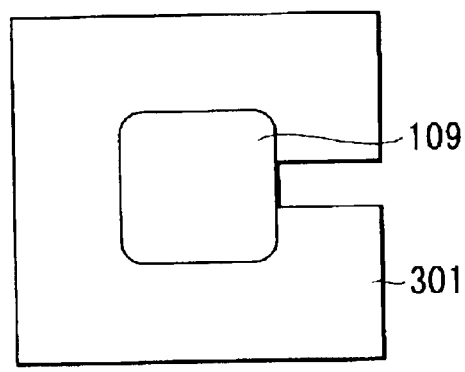
FIGS. 21 and 22 are plan views of modifications of the position control member in the first or second embodiment.
Figure 22:
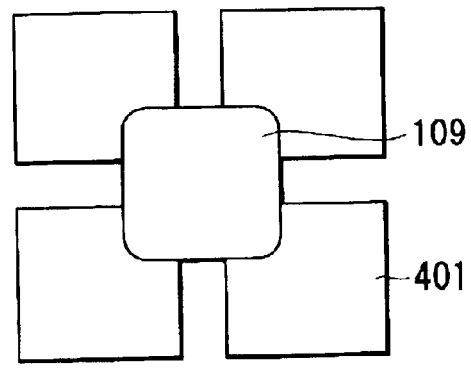

FIGS. 21 and 22 are plan views of modifications of the position control member in the first or second embodiment. For example, a position control member 301 may enclose an adhesion section 109 bonded to an active element (not shown) in such a manner that the position control member 301 has a cut in it as shown in FIG. 21. In addition, as shown in FIG. 22, a position control member 401 may enclose an adhesion section 109 bonded to an active element (not shown) in such a manner that the position control member 401 has a plurality of cuts in it as shown in FIG. 22. As in these modifications, even when the position control member encloses the active element with a cut in the member, its tapered shape enables the active elements to be selectively transferred with high position accuracy.

Use of the position control member with a cut in it allows adhesive to escape through the cut even if the amount of adhesive is too large, which prevents the adhesive from adhering to the top surface of the active element. When the position control member with a cut in it is used, it is desirable to use a highly viscous adhesive to prevent the adhesive from running short because of outflow.

The position control member may enclose only the side face of the active element as shown in the first embodiment. Alternatively, the position control member may enclose not only the side face of the active element but also its bottom surface as shown in the second embodiment. Furthermore, it is desirable that the shapes of the active element and position control member and tapered shapes of the etching stopper layer and position control member should not have rotation symmetry (have a shape out of rotation symmetry). The shape out of rotation symmetry prevents the active elements from being transferred in a different direction even if the transfer angle shifts a little in transferring them. Note that "a shape out of rotation symmetry" means the shape does not have rotation symmetry under rotation over $2\pi/N$, where N is a natural number not less than two.

(Third Embodiment)

In a third embodiment, TFTs and storage capacitors are formed as active elements at an element formation substrate. After these active elements are transferred to an intermediate substrate, they are mounted on tapered structures. Then, the resulting active elements are transferred to a final substrate at which tapered position control members have been formed. Thereafter, interconnections and such are formed to make an active matrix substrate, thereby forming a liquid-crystal display.

Figure 23:
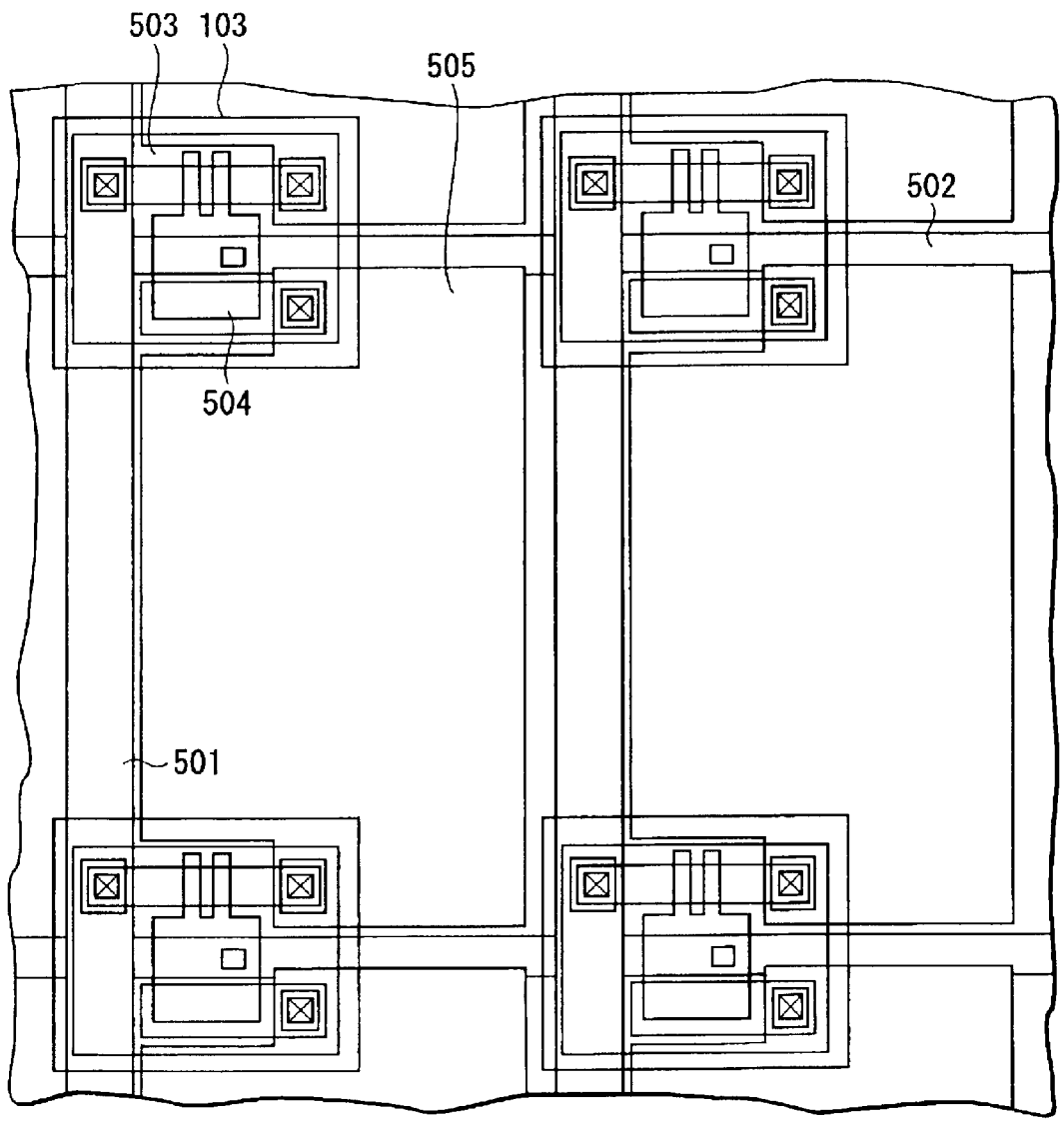
FIG. 23 is a plan view of part of a liquid-crystal display according to a third embodiment.

FIG. 23 is a sectional view of part of the liquid-crystal display in the third embodiment. A pixel of the liquid-crystal display of the third embodiment includes a signal line 501, a scanning line 502. a TFT 503, a storage capacitor 504, and a pixel electrode 505. In the third embodiment, the TFT 503 and storage capacitor 504 constitute an active element 103.

The gate of the TFT 503, which has a double gate structure to reduce off-leakage current, is connected to the scanning line 502. One of the source and drain of the TFT 503 is connected to the signal line 501 and the other is connected to the pixel electrode 505. The storage capacitor 504 has a gate overlap Cs structure that has a capacitance between the pixel electrode 505 and the neighboring scanning line 502 on the opposite side of the gate electrode 505.

In the pixel, to apply a voltage to a liquid crystal, a pulse on the scanning line 502 turns on the TFT 503 at a specific timing, thereby applying the image signal from the signal line 501 to the pixel electrode 505. The storage capacitor 504 exists between the pixel electrode 505 and the above-mentioned neighboring scanning line in the off state, which enables a charge to be held.

Figure 24:
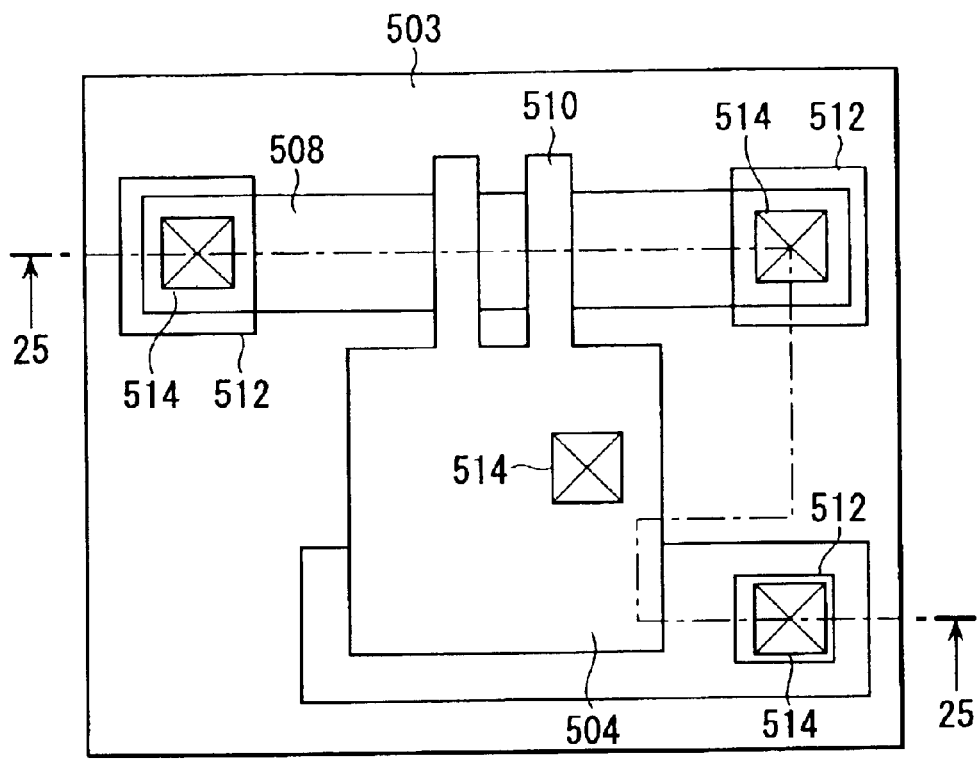
FIG. 24 is a plan view of an active element in the third embodiment.
Figure 25:
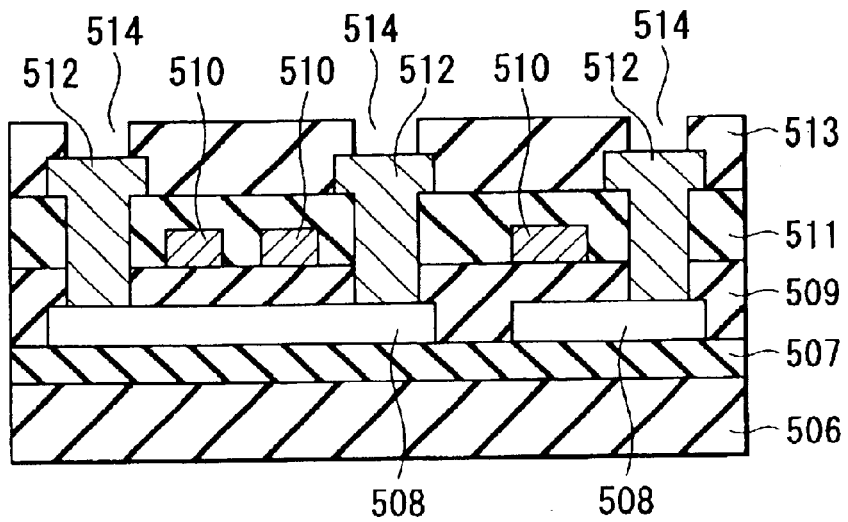
FIG. 25 is a sectional view taken along line 25—25 in FIG. 24.

Next, a method of manufacturing active elements in the third embodiment will be explained by reference to FIGS. 24 and 25. FIG. 24 is a plan view of an active element. FIG. 25 is a sectional view taken along line 25—25 in FIG. 24.

First, on an element formation substrate 506, an etching stopper layer 507 is formed using alumina to a thickness of about 100 nm.

On the entire surface of the etching stopper layer 507, amorphous silicon is deposited by CVD techniques to a thickness of about 50 nm. The amorphous silicon is crystallized by excimer laser annealing techniques, thereby forming a polycrystalline silicon layer 508. The polycrystalline silicon layer 508 is processed into island-like pieces by photolithographic techniques, thereby forming the active layers of the TFTs 503 and the lower electrodes of the storage capacitors 504. In the polycrystalline silicon layer 508, p-type impurities are doped.

Next, a silicon oxide layer is formed on the entire surface by plasma TEOS techniques to a thickness of about 100 nm, thereby forming a gate insulating layer 509.

On the entire surface of the gate insulating layer 509, an Mo—W alloy layer is formed by sputtering techniques to a thickness of about 300 nm. The resulting layer is patterned by photolithographic techniques, thereby forming the gate electrodes 510 of the TFTs 503. The gate electrodes 510 is formed with the upper electrodes of the storage capacitors 504 at the same time, and is electrically connected thereto. In the polycrystalline silicon layer 508 to make the source and drain regions on both sides of the gate electrode 510, n-type impurities are doped upto about $1 \times 10^{-12}$ cm$^{-2}$ by ion doping techniques.

On the entire surface of the gate electrode 510, a silicon oxide layer is formed by plasma CVD techniques to a thickness of about 500 nm, thereby forming an interlayer insulating layer 511. The interlayer insulating layer 511 in the regions corresponding to the source and drain regions of the TFT 503 and the lower electrode of the storage electrode 504, and the interlayer insulating layer 511 in the regions corresponding to the gate insulating layer 509 and the gate electrode of the TFT 503 are patterned, thereby forming contact sections. Then, Al or the like is formed on the entire surface by sputtering techniques. The resulting layer is patterned by photolithographic techniques, thereby forming interconnections 512 to be connected to the source and drain regions and lower electrode via the contact sections.

After the interconnections 512 are formed, an organic insulating layer, such as OPTMER (registered by JSR Corporation), is formed to a thickness of about 3 µm by spin coating techniques, thereby forming a protective layer 513. The protective layer 513 in the regions corresponding to the interconnections 512 is patterned by dry etching techniques, thereby forming opening sections 514. Thereafter, the layers around the active elements from the protective layer 513 to the etching stopper layer 507 or to the gate insulating film 509 are patterned by dry etching techniques, thereby separating the elements, which completes the active elements.

The process of transferring the active elements to an intermediate substrate, tapering the side faces of the etching stopper layer abutting the bottom surface of the elements, and transferring the resulting elements to a final substrate at which tapered position control members have been formed is carried out as in the first embodiment. Therefore, explanation of the process will be omitted.

Next, using FIGS. 23 to 25, a method of providing interconnections on the final substrate to which the active elements have been transferred, thereby forming a liquid-crystal display will be explained.

First, a first planarization layer (not shown) is formed using OPTMER by spin coating techniques on the entire surface of the final substrate to which the active elements have been transferred. The first planarization layer in the region corresponding to the opening section 514 above the gate electrode 510 is patterned, thereby making an opening. Then, a scanning line 502 to be connected to the gate electrode via the opening section 514 is formed using an Mo—W alloy by sputtering techniques.

Next, on the entire surface of the first planarization layer, a second planarization layer (not shown) is formed using OPTMER by spin coating techniques. Then, the first planarization layer and second planarization layer in the regions corresponding to the source and drain regions of the TFT 503 and the opening section 514 of the lower electrode of the storage capacitor 504 are patterned, thereby making openings. Then, a signal line 501 to be connected via the opening section 514 to one of the source drain regions and a pixel electrode 505 to be connected to the other of the source and drain regions and the lower electrode are formed using Al by sputtering techniques.

Then, the resulting substrate is coupled to an opposing substrate (not shown) on which an opposing electrode has been formed. Liquid crystal is injected into the couple, which is then sealed. This completes a liquid-crystal display of the third embodiment.

In the third embodiment, the tapered position control members and the tapered etching stopper layers enable the active elements to be selectively transferred, which makes it possible to form a liquid-crystal display having high position accuracy with respect to active elements. Since the position control members have a low wettability with the adhesion section, the adhesion section flows to the proper position, which enables the active elements to be bonded in a good state.

In the third embodiment, in the case where the ratio of the area taken up by the active elements to the total area of the final substrate is low, the active elements are formed on an element formation substrate with high density. Then, the active elements formed on the single element formation substrate are transferred to a plurality of final substrates, which makes the manufacturing processes more efficient.

Furthermore, since the position accuracy is high, even when active elements are transferred to a final substrate through a plurality of transfer processes, a variation in the deviation of the storage capacitor from the proper position is small, which enables a high-image-quality liquid-crystal display with good uniformity.

(Fourth Embodiment)

In a fourth embodiment, sets of two TFTs are formed as active elements on an element formation substrate. After these active elements are transferred to an intermediate substrate, they are each mounted on a tapered structure. Then, the resulting active elements are transferred to a final substrate on which tapered position control members have been formed. Thereafter, interconnections and such are formed to make an active matrix substrate, which completes an organic EL display.

Figure 26:
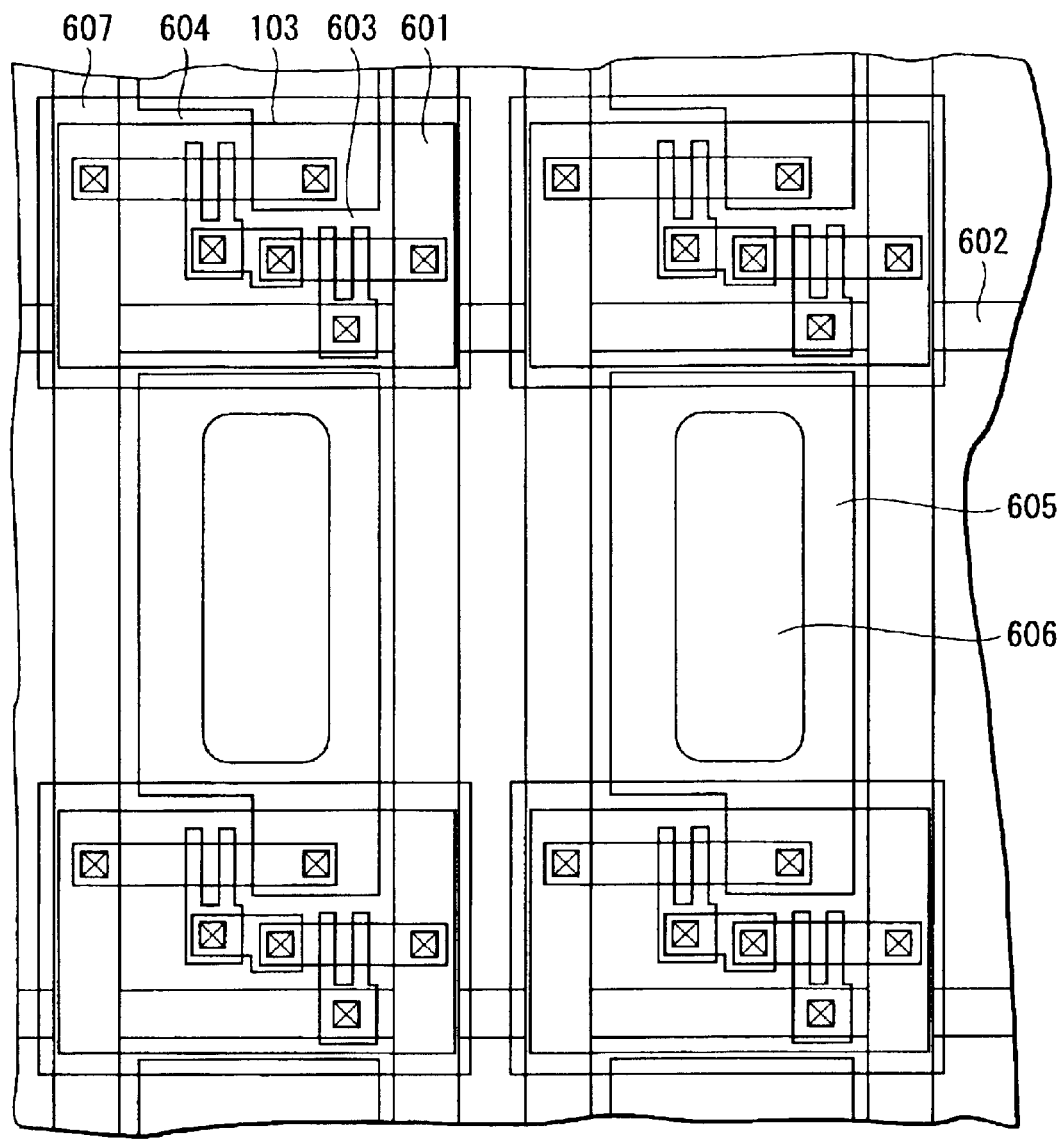
FIG. 26 is a plan view of part of an EL display according to a fourth embodiment.

FIG. 26 is a plan view of part of an organic EL display in the fourth embodiment. A pixel of the organic EL display of the fourth embodiment includes a signal line 601, a scanning line 602, a scanning TFT 603, a driving TFT 604, a pixel electrode 605, an organic EL section 606, and a power supply line 607.

In the fourth embodiment, an active element 103 has a scanning TFT 603 and a driving TFT 604. The gate of the scanning TFT 603 is connected to the scanning line 602 and one of the source and drain of the scanning TFT 603 is connected to the signal line 601 and the other is connected to the gate of the driving TFT 604. One of the source and drain of the driving TFT 604 is connected to the power supply line 607 and the other is connected to the pixel electrode 605.

With this pixel, to cause the organic EL section 606 to emit light, a pulse on the scanning line 602 turns on the scanning TFT 603 with specific timing, thereby applying the image signal from the signal line 601 to the gate of the driving TFT 604 via the scanning TFT 603. Then, the current from the power supply line 607 is supplied from the pixel electrode 605 via the driving transistor 604 to the organic EL section 606, which emits light with specific luminance.

Figure 27:
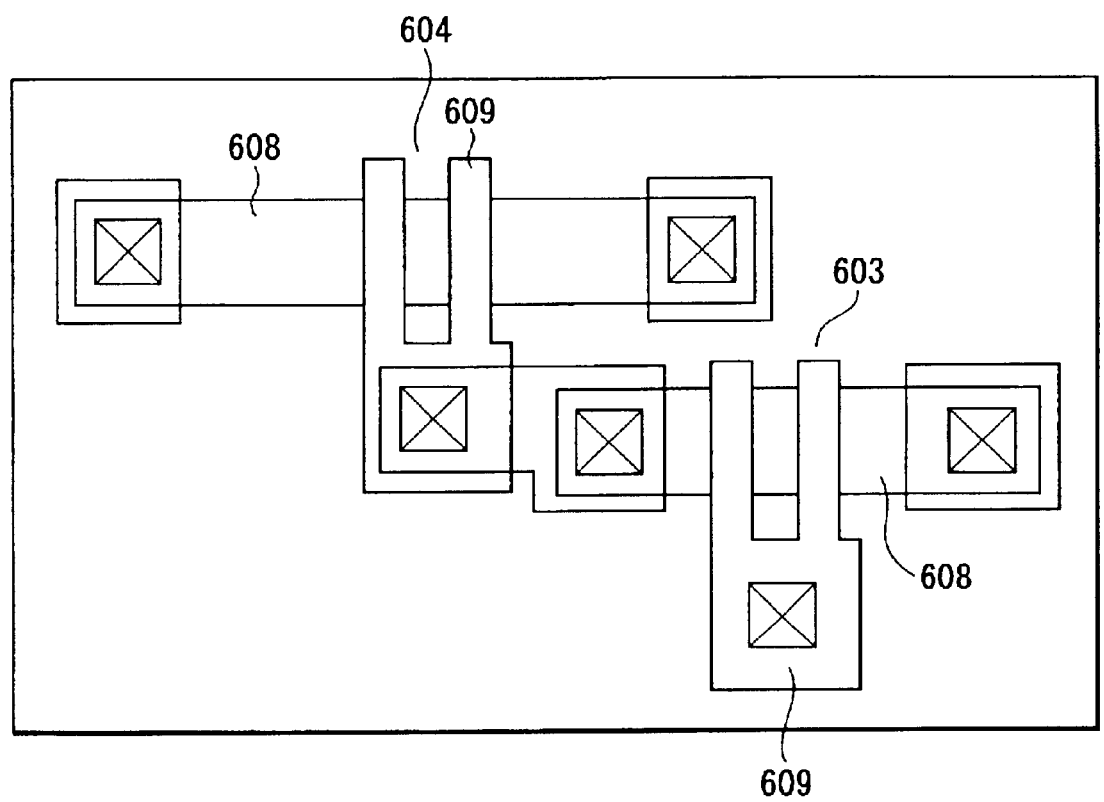
FIG. 27 is a plan view of an active element in the fourth embodiment.

As shown in FIG. 27, each active element has two TFTs. The source and drain regions of the scanning TFT 603 and driving TFT 604 are made of a polycrystalline layer 608 by the same method as in the third embodiment. Moreover, the gate electrodes 609 of the scanning TFT 603 and driving TFT 604 are made of an Mo—W alloy or the like by the same method as in the third embodiment.

In the fourth embodiment, it is possible to form an EL display which enables active elements to be selectively transferred and has high position accuracy with respect to the active elements as in the third embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An active matrix substrate comprising:
   a substrate;
   a position control member provided on said substrate and having an opening at a central portion thereof to expose a top surface of said substrate, said opening being surrounded by a sidewall of said position control member, said position control member having an inner side face which inclines at a specific angle with respect to said substrate;
   an active element provided on said position control member;
   a fitting member abutting a bottom surface of said active element and configured to engage with said inner side face of said position control member and an outer side face of said fitting member has at least a part that inclines at substantially the same angle as said specific angle of said inner side face of said position control member with respect to said substrate; and
   an adhesion section which includes an adhesive that bonds said active element to said substrate or said position control member and whose wettability with said position control member is lower than that of said adhesive with said substrate.

2. The active matrix substrate according to claim 1, wherein said wettability is defined as a contact angle of said adhesive to said position control member or said substrate and said contact angle of said adhesive to said position control member is 70° or more.

3. The active matrix substrate according to claim 1, wherein said position control member has at least one cut or through hole in said sidewall.

4. The active matrix substrate according to claim 1, wherein said active element has a shape out of rotation symmetry.

5. The active matrix substrate according to claim 1, wherein said angle of said inclined part of said outer side face of said fitting member is the same as said specific angle of inclination of said inner side face of said position control member.

6. The active matrix substrate according to claim 1, wherein a height from said top surface of said substrate to a top surface of said active element is equal to or larger than a height from said top surface of said substrate to a top surface of said position control member.

7. The active matrix substrate according to claim 1, wherein said height from said top surface of said substrate to a top surface of said position control member is equal to 0.3 μm or more and 5 μm or less.

8. An active matrix substrate comprising:
   a substrate;
   a position control member provided on a top surface of said substrate and having a concave part that is made up of an inner side face inclining at a specific angle with respect to said substrate and a bottom part connecting to said inner side face, a portion of said position control member corresponding to said bottom part of said concave part being in contact with said substrate;
   an active element provided on said position control member;
   a fitting member abutting a bottom surface of said active element and configured to engage with said concave part of said position control member and an outer side face of said fitting member has at least a part that inclines at substantially the same angle as said specific angle of said inner side face of said position control member; and
   an adhesion section which includes an adhesive that bonds said active element to said position control member, with a contact angle of said adhesive to said position control member being 70° or more.

9. The active matrix substrate according to claim 8, wherein said position control member has at least one cut or through hole in a sidewall of said concave part.

10. The active matrix substrate according to claim 8, wherein said active element has a shape out of rotation symmetry.

11. The active matrix substrate according to claim 8, wherein said angle of said inclined part of said outer side face of said fitting member is the same as said specific angle of inclination of said inner side face of said position control member.

12. The active matrix substrate according to claim 8, wherein a height from said top surface of said substrate to a top surface of said active element is equal to or larger than a height from said top surface of said substrate to a top surface of said position control member.

13. The active matrix substrate according to claim 8, wherein said height from said top surface of said substrate to a top surface of said position control member is equal to 0.3 μm or more and 5 μm or less.

* * * * *